US006836853B1

United States Patent
Dover et al.

(12) United States Patent
(10) Patent No.: US 6,836,853 B1
(45) Date of Patent: Dec. 28, 2004

(54) NON-VOLATILE MEMORY BASED MONOTONIC COUNTER

(75) Inventors: Lance W. Dover, Fair Oaks, CA (US); Andrew H. Gafken, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/477,034

(22) Filed: Dec. 31, 1999

(51) Int. Cl.[7] .......................... G06F 1/14; H03K 23/00; H03K 21/38
(52) U.S. Cl. .......................... 713/502; 377/44; 377/107
(58) Field of Search .......................... 713/502; 377/26, 377/32, 44, 107

(56) References Cited

U.S. PATENT DOCUMENTS

| | | | | |
|---|---|---|---|---|
| 4,224,506 A | * | 9/1980 | Coppola et al. | 377/32 |
| 4,562,306 A | | 12/1985 | Chou et al. | |
| 4,638,457 A | * | 1/1987 | Schrenk | 365/189.01 |
| 4,768,210 A | * | 8/1988 | Pockrandt | 365/226 |
| 4,947,410 A | | 8/1990 | Lippmann et al. | |
| 5,181,231 A | * | 1/1993 | Parikh et al. | 377/26 |
| 5,640,608 A | * | 6/1997 | Dockter et al. | 709/203 |
| 6,084,935 A | | 7/2000 | Mather | |
| 6,249,562 B1 | | 6/2001 | Wells | |
| 6,678,712 B1 | * | 1/2004 | McLaren et al. | 718/100 |

FOREIGN PATENT DOCUMENTS

| | | | | |
|---|---|---|---|---|
| EP | 274045 A1 | * | 7/1988 | G01C/22/02 |
| JP | 05290334 A | * | 11/1993 | G11B/5/455 |

OTHER PUBLICATIONS

M'hammed Hnniche, MGI: an Incremental Bottom–Up Algorithm, 1994 IEEE, pp. 347–351.*
U.S. Appl. No. 09/339,012, filed Jun. 23, 1999, entitled Counter With Non–Uniform Digit Base, by Steven E. Wells.
U.S. Appl. No.: 09/379,175, filed Aug. 23, 1999, entitled Method and System for Implementing a Digit Counter Optimized for Flash Memory, by Steven E. Wells.

* cited by examiner

Primary Examiner—Dennis M. Butler
Assistant Examiner—Suresh Suryawanshi
(74) Attorney, Agent, or Firm—Blakley, Sokoloff, Taylor & Zafman LLP (57) ABSTRACT

A value for a first counter is maintained. A value for a second counter based on a content of a non-volatile memory is maintained. Updates to the value for the first counter and to the value for the second counter are controlled.

23 Claims, 5 Drawing Sheets

NON-VOLATILE MEMORY BASED MONOTONIC COUNTER

BACKGROUND OF THE INVENTION

1. Field of the Invention

The present invention relates generally to the field of computer systems. More particularly, the present invention relates to the field of monotonic counters for use by computer systems.

2. Description of Related Art

Monotonic counters are typically used in computer systems to maintain a count that can only be incremented over the life of the counter. Monotonic counters help ensure, for example, a prior count or event based on a prior count will not happen again. Monotonic counters may be used, for example, for the assignment of unique numbers or identifiers.

BRIEF SUMMARY OF THE INVENTION

A value for a first counter is maintained. A value for a second counter based on a content of a non-volatile memory is maintained. Updates to the value for the first counter and to the value for the second counter are controlled.

BRIEF DESCRIPTION OF THE DRAWINGS

The present invention is illustrated by way of example and not limitation in the figures of the accompanying drawings, in which like references indicate similar elements and in which.

DETAILED DESCRIPTION

The following detailed description sets forth an embodiment or embodiments in accordance with the present invention for non-volatile memory based monotonic counter. In the following description, details are set forth such as specific count values, sizes, techniques, etc., in order to provide a thorough understanding of the present invention. It will be evident, however, that the present invention may be practiced without these details. In other instances, well-known computer components, etc., have not been described in particular detail so as not to obscure the present invention.

Computer System

Figure 1:
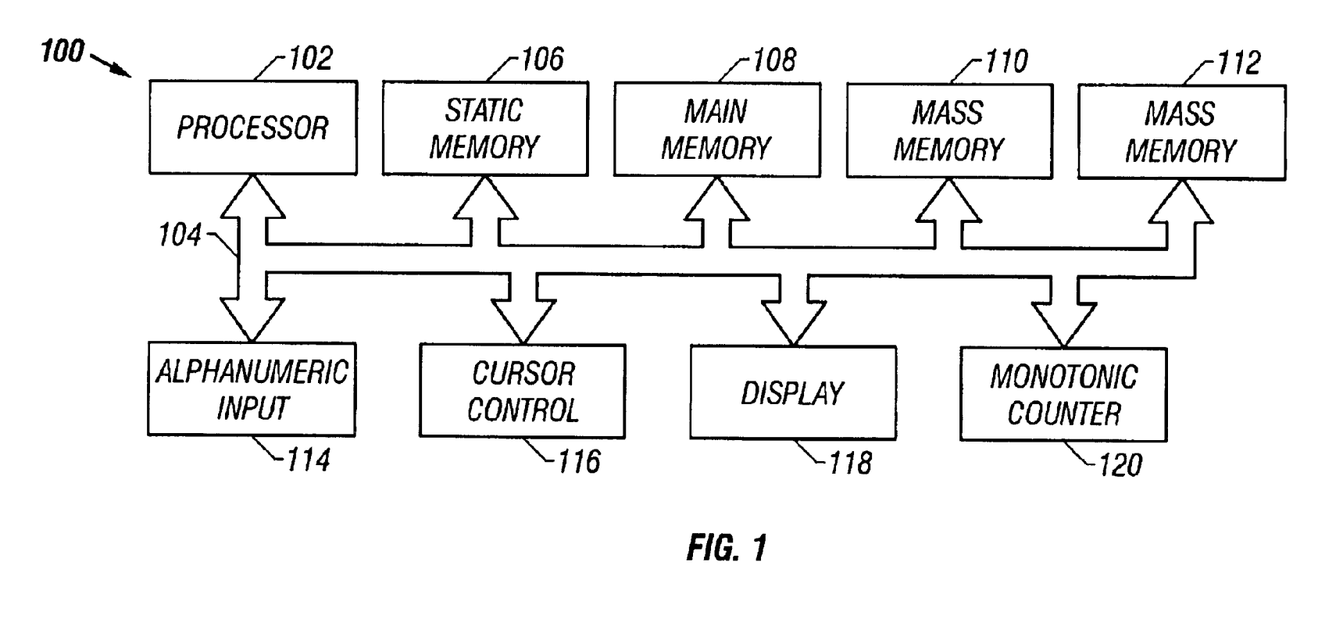
FIG. 1 illustrates an exemplary computer system comprising a non-volatile memory based monotonic counter.

FIG. 1 illustrates an exemplary computer system 100 comprising a processor 102, a bus 104, a static memory 106, a main memory 108, mass memories 110 and 112, an alphanumeric input device 114, a cursor control device 116, a display 118, and a non-volatile memory based monotonic counter 120 in accordance with the present invention. Bus 104 couples processor 102, static memory 106, main memory 108, mass memories 110 and 112, alphanumeric input device 114, cursor control device 116, display 118, and monotonic counter 120.

Processor 102 comprises a suitable processing device such as a microprocessor, for example. Processor 102 may execute instructions stored in static memory 106, main memory 108, mass memory 110, and/or mass memory 112 for example. Processor 102 may process data stored in static memory 106, main memory 108, mass memory 110, and/or mass memory 112 for example. For another embodiment, computer system 100 may comprise more than one processor coupled to bus 104 for executing instructions and/or processing data, for example.

Static memory 106, main memory 108, and mass memories 110 and 112 may each comprise any suitable computer readable medium for storing data and/or instructions, for example. Static memory 106 may comprise read only memory (ROM) or any other suitable memory device. Static memory 106 may store, for example, a boot program for execution by processor 102 to initialize computer system 100. Main memory 108 may comprise random access memory (RAM) or any other suitable memory device for use as a working memory, for example, for processor 102. Mass memories 110 and 112 may each comprise a hard disk device, a floppy disk or diskette device, an optical disk device such as a compact disc (CD) or digital video disc (DVD) device for example, a Bernoulli disk device such as a Jaz or Zip disk device for example, a flash memory device, a file server device, and/or any other suitable memory device. For one embodiment, mass memory 110 comprises a hard disk device and mass memory 112 comprises an optical disk device. For this detailed description, suitable computer readable medium encompasses any suitable medium for storing information, such as data and/or instructions for example, in a form readable by a computer. Suitable computer readable medium encompasses not only a single memory device but also any combination of suitable memory devices.

Bus 104 provides for the communication of digital information between hardware devices for computer system 100. The hardware devices for computer system 100 may or may not be local with respect to one another. Bus 104 may comprise any suitable communication hardware such as a local bus, a system bus, a local area network (LAN), a wide area network (WAN), or the Internet, for example, and may comprise any combination of suitable communication hardware.

Processor 102 may receive over bus 104 information that is input by a user through alphanumeric input device 114 and/or cursor control device 116. Alphanumeric input device 114 may comprise a keyboard, for example, that comprises alphanumeric keys. Alphanumeric input device 114 may comprise other suitable keys, such as function keys for example. Alphanumeric input device 114 may be used to input information or commands, for example, for computer system 100. Cursor control device 116 may comprise a mouse, touch tablet, track-ball, and/or joystick, for example, for controlling the movement of a cursor displayed by display 118 or may comprise suitable touch screen hardware and/or software for use with display 118.

Processor 102 may also output over bus 104 information that is to be displayed on display 118. Display 118 may comprise a cathode ray tube (CRT) or a liquid crystal display (LCD), for example, for displaying information to a user. Processor 102 may use bus 104 to transmit information to and to receive information from other hardware devices, such as mass memories 110 and 112 for example.

Non-volatile memory based monotonic counter 120 maintains a count or value that can only be updated by a suitable number or quantity in one direction. That is, monotonic counter 120 can only increment its value by a suitable number or decrement its value by a suitable number, but not both. Processor 102 may use monotonic counter 120 for any suitable purpose. Processor 102 may use monotonic counter 120, for example, to help prevent the reoccurrence of a prior count or of a prior event based on a prior count. Processor 102 may use monotonic counter 120, for example, for the assignment of unique numbers or identifiers. As illustrated in FIG. 1, processor 102 may access the count or value maintained by monotonic counter 120 using bus 104. For an alternative embodiment, monotonic counter 120 may be coupled to processor 102 by a private or dedicated bus, for example.

Computer system 100 may be a desktop personal computer (PC) system, a laptop or notebook computer system, or any other suitable computer system. Although monotonic counter 120 is described as being accessed by processor 102 in computer system 100, monotonic counter 120 may be accessed by any suitable device or component in any suitable computer system configured with any suitable combination of hardware devices.

Non-Volatile Memory Based Monotonic Counter

Monotonic counter 120 may comprise any suitable circuitry to maintain a count or value of any suitable size. Monotonic counter 120 may maintain the value from any suitable minimum value up to any suitable maximum value or from any suitable maximum value down to any suitable minimum value. Monotonic counter 120 for one embodiment maintains a 64-bit value that can be incremented up to a maximum value of FFFF FFFF FFFF FFFFh, for example. Monotonic counter 120 may update its value by any suitable number in one direction in accordance with any suitable technique. For one embodiment, monotonic counter 120 updates its value by a suitable number in the one direction when the value for monotonic counter 120 is read by processor 102, for example. By updating its value each time the value is read, monotonic counter 120 helps ensure the same value is not read more than once.

Monotonic counter 120 comprises non-volatile memory to help ensure the same value is not read more than once despite the deactivation or loss of power to monotonic counter 120. Monotonic counter 120 may store in such non-volatile memory any suitable information on which monotonic counter 120 may at least partially base its value. Monotonic counter 120 may at least partially base its value on the content of such non-volatile memory in any suitable manner. In the event power to monotonic counter 120 is lost or deactivated after its value is read but before it is updated, monotonic counter 120 may also update its value by a suitable number when monotonic counter 120 is powered on. Monotonic counter 120 may be powered on, for example, when computer system 100 is powered on.

Monotonic counter 120 may comprise any suitable non-volatile memory that maintains its stored content when power to monotonic counter 120 is lost or deactivated. Suitable non-volatile memory devices for monotonic counter 120 include, without limitation, a flash memory device, a flash disk device, an electrically erasable programmable read only memory (EPROM) device, and any suitable battery-backed memory device, for example. Monotonic counter 120 may use only one or any suitable combination of more than one suitable non-volatile memory device.

Figure 2:
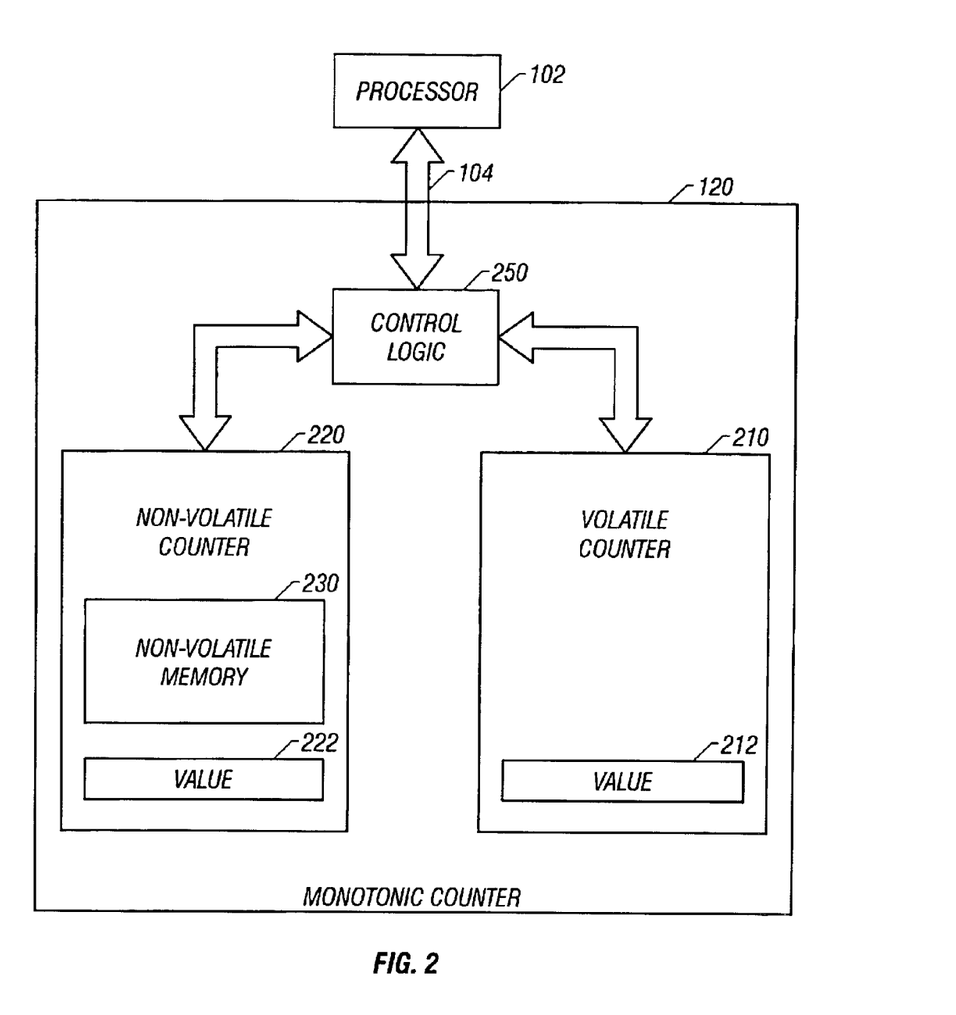
FIG. 2 illustrates, for one embodiment, a non-volatile memory based monotonic counter comprising a volatile counter and a non-volatile counter.

As illustrated in FIG. 2, monotonic counter 120 for one embodiment comprises a volatile counter 210, a non-volatile counter 220, and control logic 250 coupled to volatile counter 210 and non-volatile counter 220. Volatile counter 210 maintains a count or value forming, for example, a least significant portion of the value maintained by monotonic counter 120. Non-volatile counter 220 maintains a count or value forming, for example, a most significant portion of the value maintained by monotonic counter 120. The values maintained by volatile counter 210 and non-volatile counter 220 may each be of any suitable size. Where monotonic counter 120 maintains a 64-bit value, for example, the value for volatile counter 210 may be, for example, 40 bits in length and the value for non-volatile counter 220 may be, for example, 24 bits in length.

Volatile counter 210 is a volatile memory based counter and may comprise any suitable circuitry for maintaining a count or value. Volatile counter 210 for one embodiment comprises a suitable memory 212, such as a random access memory (RAM) register for example, for storing its value.

Non-volatile counter 220 is a non-volatile memory based counter and may comprise any suitable circuitry for maintaining a count or value. Non-volatile counter 220 comprises a non-volatile memory 230 for storing any suitable information on which non-volatile counter 220 may base its value. Non-volatile counter 220 may base its value on the content of non-volatile memory 230 in any suitable manner. Non-volatile counter 220 may optionally comprise a suitable memory 222, such as a register for example, for storing its value.

Control logic 250 controls volatile counter 210 and non-volatile counter 220. Control logic 250 may comprise any suitable circuitry and may interface with volatile counter 210 and non-volatile counter 220 in any suitable manner to control volatile counter 210 and non-volatile counter 220. Control logic 250 provides read access to the value for monotonic counter 120, that is, to the values for volatile counter 210 and non-volatile counter 220, for processor 102, for example. Control logic 250 also controls volatile counter 210 and non-volatile counter 220 to update their respective values by any suitable number in accordance with any suitable technique. Control logic 250 may control volatile counter 210 to update its value, for example, when the value for monotonic counter 120 is read by processor 102. Control logic 250 may control non-volatile counter 220 to update its value, for example, when the value for volatile counter 210 meets a predetermined condition, such as equaling or exceeding a predetermined value for example, and/or when monotonic counter 120 is powered on. Control logic 250 for one embodiment helps ensure the same value for monotonic counter 120 is not read more than once by disabling read access to the values for volatile counter 210 and non-volatile counter 220 while the value for volatile counter 210 and/or the value for non-volatile counter 220 are updated.

The value for volatile counter 210 may be updated quickly relative to updating the value for non-volatile counter 220 as non-volatile memory 230 may require relatively more time to update. Accordingly, processor 102 for one embodiment may access the value for monotonic counter 120 relatively more frequently once monotonic counter 120 has been powered on as only the value for volatile counter 210 will be updated in response to most reads of the value for monotonic counter 120 by processor 102. The value for volatile counter 210 may be sized such that the value for non-volatile counter 220 will not likely be updated as a result of the value for volatile counter 210 meeting a predetermined condition such as equaling or exceeding a predetermined value, for example. Because the value for volatile counter 210 is not retained upon a loss or deactivation of power to monotonic counter 120, control logic 250 for one embodiment updates non-volatile counter 220 each time monotonic counter 120 is powered on to help prevent the reoccurrence of a prior value for monotonic counter 120.

The size of the values maintained by volatile counter 210 and non-volatile counter 220 may be selected, for example, based on the desired life expectancy of monotonic counter 120 within its desired environment. If monotonic counter 120 is powered on relatively infrequently and the value for monotonic counter 120 is read relatively frequently, for example, monotonic counter 120 for one embodiment may have a relatively larger sized value for volatile counter 210 and a relatively smaller sized value for non-volatile counter 220.

Figure 3:
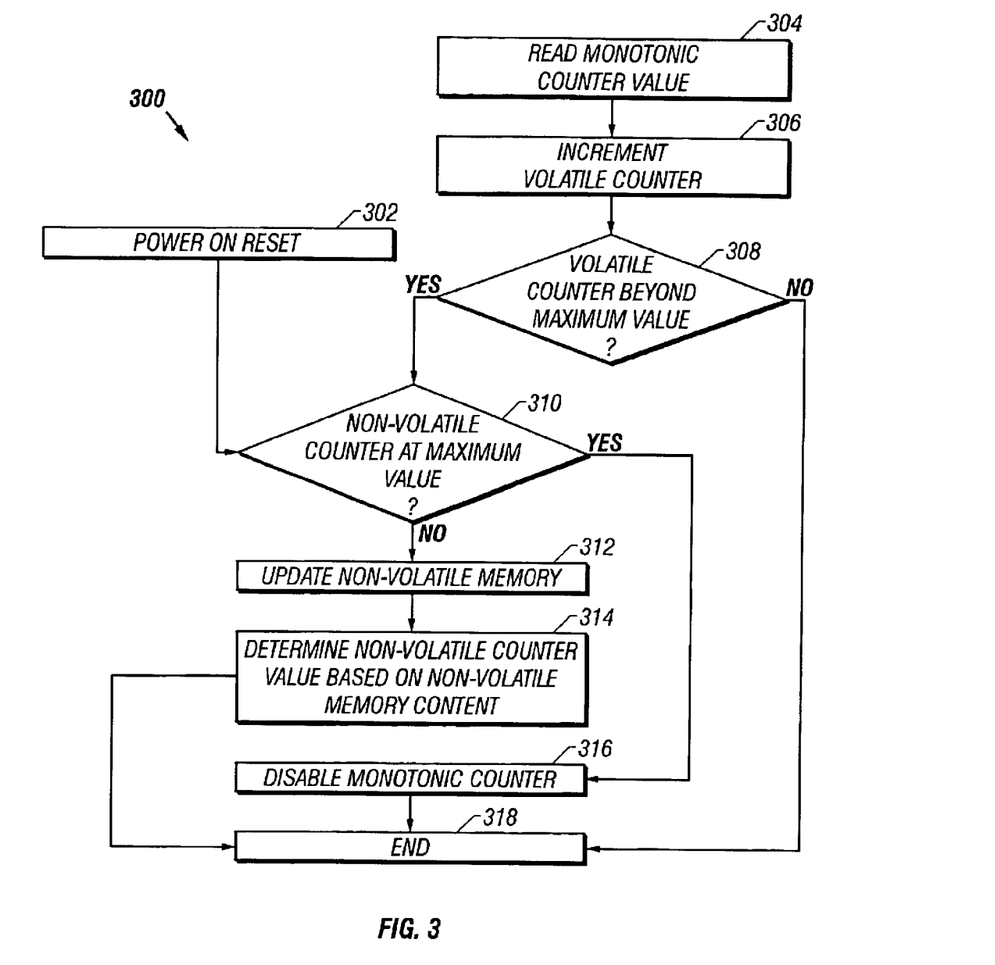
FIG. 3 illustrates, for one embodiment, a flow diagram for maintaining a value by a non-volatile memory based monotonic counter.

Control logic 250 for one embodiment controls monotonic counter 120 in accordance with a flow diagram 300 as illustrated in FIG. 3. For flow diagram 300, monotonic counter 120 updates its value by a suitable number in response to a power on reset of monotonic counter 120 for block 302 or in response to a read of the value for monotonic counter 120 for block 304.

At a power on reset of monotonic counter 120 for block 302, the value for volatile counter 210 is set to a suitable initial minimum value, such as zero for example. As information stored in non-volatile memory 230 is retained despite the prior deactivation or loss of power to monotonic counter 120, the value for non-volatile counter 220 prior to the deactivation or loss of power to monotonic counter 120 may be restored. Prior to any use of monotonic counter 120, non-volatile memory 230 may be set with suitable information corresponding to an initial minimum value, such as zero for example, for non-volatile counter 220.

Control logic 250 for block 310 determines whether incrementing the value for non-volatile counter 220 by a predetermined number, such as one for example, will exceed a predetermined maximum value. Where non-volatile counter 220 maintains a 24-bit value, for example, the predetermined maximum value may be FF FFFFH, for example. If incrementing the value for non-volatile counter 220 by the predetermined number will not exceed the predetermined maximum value, control logic 250 controls non-volatile counter 220 to increment its value by the predetermined number for blocks 312 and 314. Control logic 250 controls non-volatile counter 220 to update non-volatile memory 230 in a suitable manner for block 312 and to determine the value for non-volatile counter 220 based on the content of non-volatile memory 230 for block 314. Control logic 250 then ends for block 318.

Processor 102 may read the value for monotonic counter 120 for block 304, for example, by addressing monotonic counter 120 over bus 104 in a suitable manner. Control logic 250 may then output the current values for volatile counter 210 and non-volatile counter 220 to processor 102 over bus 104. Control logic 250 for block 306 then controls volatile counter 210 to increment its value by a suitable number, such as one for example. For block 308, control logic 250 determines whether the value for volatile counter 210 has been incremented beyond a predetermined maximum value. Any suitable predetermined maximum value may be used. Where volatile counter 210 maintains a 40-bit value, for example, the predetermined maximum value may be FF FFFF FFFFh, for example. If the value for volatile counter 210 has not been incremented beyond the predetermined maximum value, control logic 250 ends for block 318.

If the value for volatile counter 210 has been incremented beyond the predetermined maximum value, the value for volatile counter 210 is reset to a suitable initial minimum value, such as zero for example. Control logic 250 controls non-volatile counter 220 to increment its value, if possible, for blocks 310–314.

Control logic 250 for one embodiment disables access to the values for volatile counter 210 and non-volatile counter 220 while the value for volatile counter 210 and/or the value for non-volatile counter 220 are updated. Control logic 250 may disable access to the values for volatile counter 210 and non-volatile counter 220 in any suitable manner, for example, after a power on reset for block 302 and after a read of the value for monotonic counter 120 for block 304. Control logic 250 may then enable access to the values for volatile counter 210 and non-volatile counter 220 after block 314.

When incrementing the value for non-volatile counter 220 by the predetermined number will exceed the predetermined maximum value as determined for block 310, control logic 250 for block 316 disables monotonic counter 120 and ends for block 318. Control logic 250 may disable monotonic counter 120 in any suitable manner, such as by disabling access to monotonic counter 120 or by controlling volatile counter 210 to lock its value at a predetermined value, such as zero for example, and controlling non-volatile counter 220 to lock its value at a predetermined value, such as zero for example.

For another embodiment, the value for monotonic counter 120 may be based solely on the value for non-volatile counter 220. That is, monotonic counter 120 may exclude volatile counter 210. Flow diagram 300 may then be modified by removing blocks 306 and 308 such that control logic 250 determines whether incrementing the value for non-volatile counter 220 will exceed a predetermined maximum value for block 310 after the value for monotonic counter 120 has been read for block 304.

Although described as incrementing the value for monotonic counter 120, flow diagram 300 may be appropriately modified to decrement the value for monotonic counter 120 from a suitable initial maximum value to a suitable minimum value.

Flow diagram 300 may also be modified in other suitable manners. As one example, in lieu of blocks 306 and 308, control logic 250 may determine whether the value for volatile counter 210 is at a predetermined maximum value. If not, control logic 250 may then increment the value for volatile counter 210 and end for block 318. If so, control logic 250 may then reset the value for volatile counter 210 and proceed to block 310. Flow diagram 300 may also be modified by performing block 310 after block 312 or after block 314.

Flash Memory Based Monotonic Counter

Figure 4:
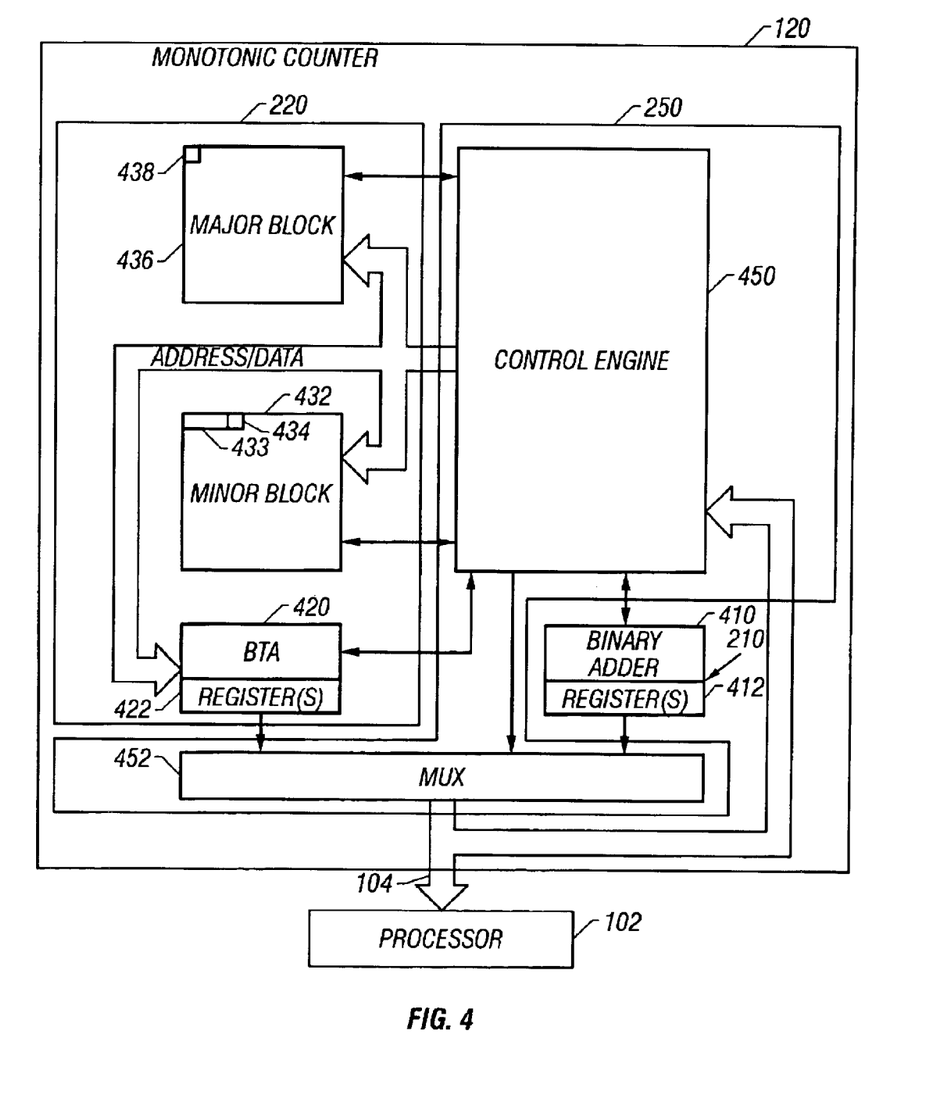
FIG. 4 illustrates, for one embodiment, a flash memory based monotonic counter.

Monotonic counter 120 for one embodiment uses flash memory for non-volatile memory 230, as illustrated in FIG. 4.

For the illustration of FIG. 4, volatile counter 210 comprises a binary adder 410 and one or more registers 412 corresponding to memory 212. Binary adder 410 may comprise any suitable circuitry. Register(s) 412 for one embodiment comprise five 8-bit registers for storing a 40-bit value for volatile counter 210.

Non-volatile counter 220 comprises a binary twiddle adder (BTA) 420, one or more registers 422, a minor block of flash memory 432, and a major block of flash memory 436. BTA 420 may comprise any suitable circuitry. Register(s) 422 correspond to memory 222 and for one embodiment comprise three 8-bit registers for storing a 24-bit value for non-volatile counter 220. Minor block 432 and major block 436 correspond to non-volatile memory 230.

Minor block 432 may comprise any suitable number of bit locations, such as 4096 for example. The bit locations of minor block 432 for one embodiment may each be programmed individually and are erased all at the same time. Each bit location within a byte may be programmed, for example, at a different time without first erasing the entire byte. This technique is also referred to as bit twiddling. Each bit location may be individually programmed to a logical zero state, for example, and erased with all other bit locations in minor block 432 to a default or logical one state, for example.

For one embodiment, a suitable number of the bit locations of minor block 432 are ready bit locations 433. Ready bit locations 433 are used to indicate a status of minor block 432. When ready bit locations 433 are set in a predetermined manner, the other bit locations of minor block 432 comprise valid information. When ready bit locations 433 are not set in the predetermined manner, the other bit locations of minor block 432 do not comprise valid information. Minor block 432 may not comprise valid information when power to monotonic counter 120 is lost or monotonic counter 120 is deactivated while the bit locations of minor block 432 are being erased. Ready bit locations 433 may be set in any suitable manner to indicate minor block 432 comprises valid information. As ready bit locations 433 for one embodiment are erased with the other bit locations of minor block 432, ready bit locations 433 may be set, for example, in a manner which indicates a loss or deactivation of power to monotonic counter 120 during an erase of minor block 432 has not likely occurred. Minor block 432 for one embodiment comprises 16 ready bit locations 433 that may be set to F0F0h, for example, to indicate the information in minor block 432 is valid. Ready bit locations 433 may reside at any suitable location in minor block 432, such as at the most significant address location(s) for example.

Major block 436 may comprise any suitable number of bit locations, such as 4096 for example. The bit locations of major block 436 for one embodiment may each be programmed similarly as those for minor block 432. The bit locations of major block 436 for one embodiment are not erased during the life of monotonic counter 120.

The value for non-volatile counter 220 is based on information stored in minor block 432 and major block 436. Minor block 432 may be updated by a suitable number for one embodiment by programming that number of bit location(s) in minor block 432. Major block 436 may be updated by a suitable number for one embodiment by programming that number of bit location(s) in major block 436 when minor block 432 meets a predetermined condition, such as when a maximum number of bit locations in minor block 432 have been programmed for example. Minor block 432 may then be erased. BTA 420 may determine the value for non-volatile counter 220 based on the number of programmed bit location(s) in minor block 432 and major block 436.

Figure 5:
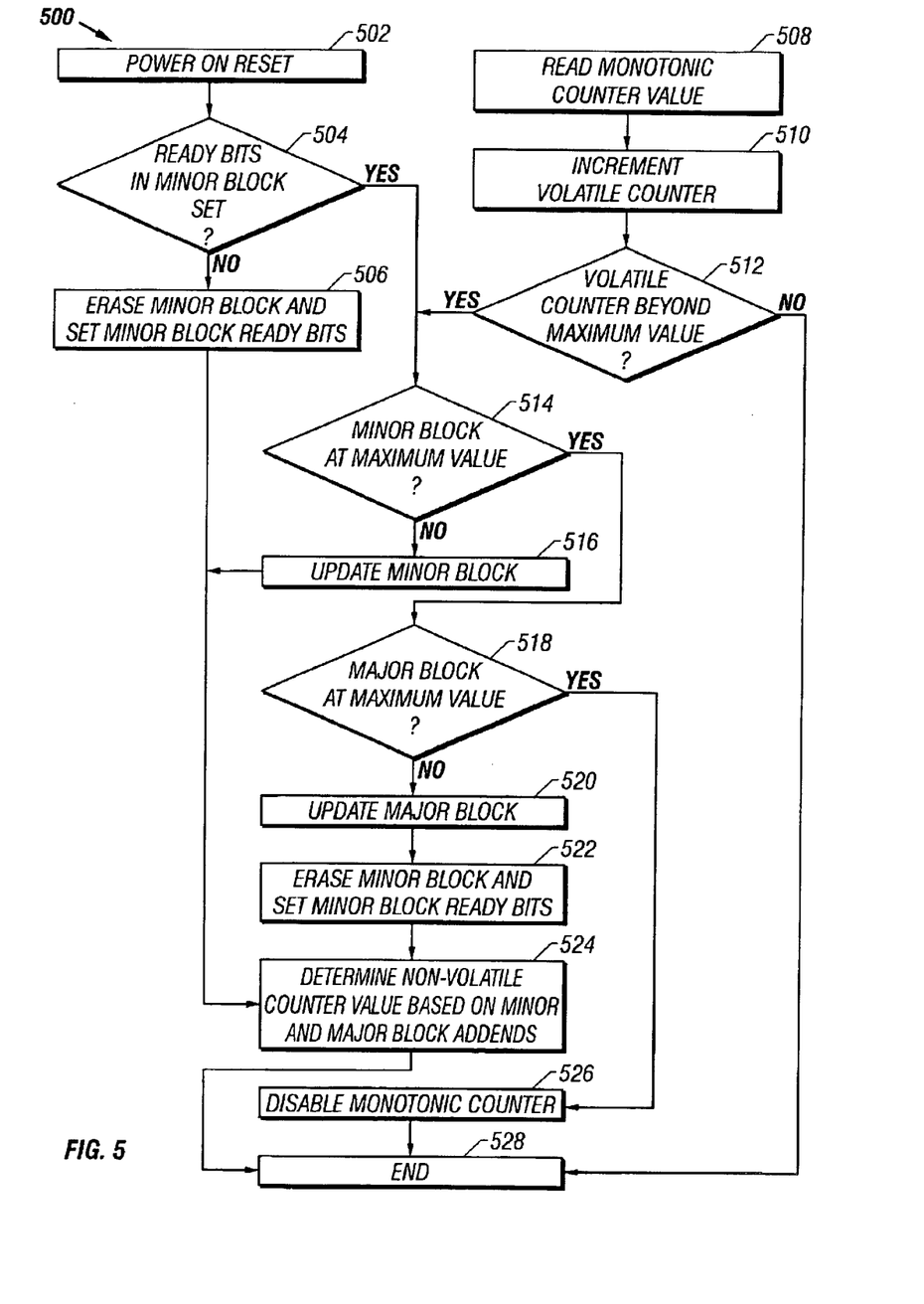
FIG. 5 illustrates, for one embodiment, a flow diagram for maintaining a value by a flash memory based monotonic counter.

Control logic 250 comprises control engine 450 and multiplexer (MUX) 452. Control engine 450 controls monotonic counter 120 and may comprise any suitable circuitry to control monotonic counter 120 in accordance with any suitable technique. Control engine 450 for one embodiment controls monotonic counter 120 in accordance with a flow diagram 500 as illustrated in FIG. 5. For flow diagram 500, monotonic counter 120 updates its value by a suitable number in response to a power on reset of monotonic counter 120 for block 502 or in response to a read of the value for monotonic counter 120 by processor 102, for example, for block 508.

At power on reset of monotonic counter 120 for block 502, the value stored in register(s) 412 is set to a suitable initial minimum value, such as zero for example. Control engine 450 for block 504 determines whether ready bit locations 433 of minor block 432 are set in a predetermined manner indicating the information stored in the other bit locations of minor block 432 are valid. Control engine 450 may examine ready bit locations 433 in any suitable manner, such as by addressing minor block 432 at ready bit locations 433. At initial factory setting for minor block 432, for one embodiment, ready bit locations 433 are set in the predetermined manner and the other bit locations are set in a default or erased state.

Control engine 450 for block 514 determines whether minor block 432 may be updated any further. That is, control engine 450 determines whether a maximum number of bit locations of minor block 432 have been programmed. Any suitable maximum number may be used and may depend, for example, on the number of bit location(s) that are to be programmed the next time minor block 432 is updated. For one embodiment, where one bit location is programmed for each update of minor block 432, the maximum number may be the total number of bit locations of minor block 432 excluding ready bit locations 433. Minor block 432 for one embodiment may have a maximum number of 4080 bit locations programmed.

Control engine 450 may determine whether a maximum number of bit locations of minor block 432 have been programmed in any suitable manner. For one embodiment, control engine 450 examines the state of a carry bit 434 of minor block 432. Carry bit 434 is the last of the maximum number of programmable bit locations for minor block 432. Control engine 450, for example, may receive carry bit 434 as an output signal from minor block 432 or may address the bit location for carry bit 434. For another embodiment, control engine 450 for block 514 may count the number of programmed bit locations in minor block 432.

If a maximum number of bit locations of minor block 432 have not been programmed, control engine 450 for block 516 updates minor block 432 by a predetermined number, such as one for example, by programming that number of suitable bit location(s) of minor block 432. Control engine 450 may program bit locations in minor block 432 in any suitable manner and in any suitable order. Control engine 450 for one embodiment programs bit locations of minor block 432 in order of increasing significance starting with the least significant bit location in minor block 432. The least significant bit location in minor block 432 for one embodiment is bit location 0 of byte address 00h in minor block 432.

Control engine 450 for block 524 controls BTA 420 to determine the value for non-volatile counter 220 based on the number of programmed bit location(s) in minor block 432 and major block 436. Control engine 450 may control BTA 420 for block 524 in any suitable manner.

For one embodiment, control engine 450 asserts a START signal to BTA 420. BTA 420 in response deasserts a DONE signal to control engine 450, counts the number of programmed bit location(s) in minor block 432 and major block 436, and stores those numbers as a minor block addend and a major block addend, respectively. BTA 420 may store the minor block addend and the major block addend in any suitable memory. BTA 420 for one embodiment stores the minor block addend and the major block addend each in a respective register of a suitable size in BTA 420. For another embodiment, control engine 450 may count the number of programmed bit location(s) in minor block 432 and major block 436 and store those numbers in BTA 420.

BTA 420 for one embodiment determines the value for non-volatile counter 220 as $(N_{MAJ} *(S_{MIN}+1))+N_{MIN}$, where $N_{MIN}$ is the minor block addend, $N_{MAJ}$ is the major block addend, $S_{MIN}$ is the maximum number of programmable bit locations in minor block 432, and I is the predetermined number with which minor block 432 is updated BTA 420 stores the value for non-volatile counter 220 in register(s) 422 and asserts the DONE signal to control engine 450. Control engine 450 then deasserts the START signal to BTA 420. Control engine 450 ends for block 528.

Processor 102 may read the value for monotonic counter 120 for block 508, for example, by addressing monotonic counter 120 over bus 104 in a suitable manner. Control engine 450 in response enables MUX 452 to output the value for volatile counter 210 from register(s) 412 and the value for non-volatile counter 220 from register(s) 422 to processor 102 over bus 104. Control engine 450 for block 510 signals binary adder 410 to increment the value for volatile counter 210 in register(s) 412 by a suitable number, such as one for example. Binary adder 410 may increment the value in register(s) 412 in any suitable manner.

For block 512, control engine 450 determines whether the value for volatile counter 210 has been incremented beyond a predetermined maximum value. Any suitable predetermined maximum value may be used. Where volatile counter 210 maintains a 40-bit value, for example, the predetermined maximum value may be FF FFFF FFFFh, for example. Control engine 450 may determine whether the value for volatile counter 210 has been incremented beyond the predetermined maximum value in any suitable manner. For one embodiment, control engine 450 examines the state of a carry bit signal generated by binary adder 410 when the value for volatile counter 210 has been incremented beyond the predetermined maximum value. The carry bit signal may, for example, be read by control engine 450 or output to control engine 450 by binary adder 410. For another embodiment, control engine 450 may read the value for volatile counter 210 and compare the read value to the predetermined maximum value. If the value for volatile counter 210 has not been incremented beyond the predetermined maximum value, control engine 450 ends for block 528.

Processor 102 may continue to read the value for monotonic counter 120. When the value for volatile counter 210 has been incremented beyond the predetermined maximum value, as determined for block 512, the value for volatile counter 210 is reset to a suitable initial minimum value, such as zero for example. For one embodiment where the predetermined maximum value is the maximum possible value that may be stored by register(s) 412, the value for volatile counter 210 rolls over when incremented beyond the predetermined maximum value.

Control engine 450 for block 514 determines whether a maximum number of bit locations of minor block 432 have been programmed. If the minor block addend and the value for non-volatile counter 220 have been determined in the current power cycle, control engine 450 for one embodiment for block 514 may examine the minor block addend or the value for non-volatile counter 220 to determine whether a maximum number of bit locations of minor block 432 have been programmed. If the maximum number of bit locations of minor block 432 have not been programmed, control engine 450 updates minor block 432 by a predetermined number, such as one for example, for block 516 by programming that number of suitable bit location(s) of minor block 432.

For block 524, control engine 450 controls BTA 420 to update the value for non-volatile counter 220. If the value for non-volatile counter 220 has been determined in the current power cycle, BTA 420 for one embodiment for block 524 may increment the minor block addend and the value for non-volatile counter 220 by the predetermined number without counting the number of programmed bit location(s) in minor block 432 and major block 436. Control engine 450 then ends for block 528.

Control engine 450 continues to update minor block 432 when monotonic counter 120 is powered on and when the value for volatile counter 210 is incremented beyond a predetermined maximum value. When a maximum number of bit locations of minor block 432 have been programmed as determined for block 514, control engine 450 for block 518 determines whether major block 436 may be updated any further. That is, control engine 450 determines whether a maximum number of bit locations of major block 436 have been programmed. Any suitable maximum number may be used and may depend, for example, on the number of bit location(s) that are to be programmed the next time major block 436 is updated. For one embodiment, where one bit location is programmed for each update of major block 436, the maximum number may be the total number of bit locations of major block 436. Major block 436 for one embodiment may have a maximum number of 4096 bit locations programmed. At initial factory setting for one embodiment, the bit locations for major block 436 are set in a default or erased state.

Control engine 450 may determine whether a maximum number of bit locations of major block 436 have been programmed in any suitable manner. For one embodiment, control engine 450 examines the state of a carry bit 438 of major block 436. Carry bit 438 is the last of the maximum number of programmable bit locations for major block 436. Control engine 450, for example, may receive carry bit 438 as an output signal from major block 436 or may address the bit location for carry bit 438. For another embodiment, control engine 450 for block 518 may count the number of programmed bit locations in major block 436 or may examine the major block addend or the value for non-volatile counter 220 to determine whether a maximum number of bit locations of major block 436 have been programmed.

If a maximum number of bit locations of major block 436 have not been programmed, control engine 450 for block 520 updates major block 436 by a predetermined number, such as one for example, by programming that number of suitable bit location(s) of major block 436. Control engine 450 may program bit locations in major block 436 in any suitable manner and in any suitable order. Control engine 450 for one embodiment programs bit locations of major block 436 in order of increasing significance starting with the least significant bit location in major block 436. The least significant bit location in major block 436 for one embodiment is bit location 0 of byte address 00h in major block 436.

For block 522, control engine 450 erases all bit locations in minor block 432 and then sets ready bit locations 433 to indicate the information stored in minor block 432 is valid. Control engine 450 may erase minor block 432 in any suitable manner. As the number of times minor block 432 is to be erased over the life of monotonic counter 120 depends, for example, on the number of bit locations that may be programmed in major block 436, minor block 432 and major block 436 may each be suitably sized for a given maximum value for non-volatile counter 220 to help ensure minor block 432 can withstand being erased throughout the life of monotonic counter 120.

Control engine 450 for block 524 controls BTA 420 to update the value for non-volatile counter 220. If the value for non-volatile counter 220 has been previously determined in the current power cycle, BTA 420 for one embodiment for block 524 may appropriately update the major block addend and the minor block addend and the value for non-volatile counter 220 without counting the number of programmed bit location(s) in minor block 432 and major block 436. Control engine 450 then ends for block 528.

Because power to monotonic counter 120 may be lost or deactivated while minor block 432 is erased, control engine 450 at each power on reset of monotonic counter 120 determines for block 504 whether ready bit locations 433 of minor block 432 are set in a predetermined manner indicating the information stored in minor block 432 is valid. If not, indicating minor block 432 has not been fully erased, control engine 450 for block 506 erases all bit locations in minor block 432 and then sets ready bit locations 433 to indicate the information stored in minor block 432 is valid. Control engine 450 then controls BTA 420 for block 524 to update the value for non-volatile counter 220 and ends for block 528.

Control engine 450 for one embodiment disables access to the values for volatile counter 210 and non-volatile counter 220 while the value for volatile counter 210 and/or the value for non-volatile counter 220 are updated. Control engine 450 may disable access to the values for volatile counter 210 and non-volatile counter 220 in any suitable manner, for example, after a power on reset for block 302 and after a read of the value for monotonic counter 120 for block 508. Control engine 450 may then enable access to the values for volatile counter 210 and non-volatile counter 220 after block 524. Control engine 450 for one embodiment may disable and enable any output of the values for volatile counter 210 and non-volatile counter 220 by disabling and enabling MUX 452, respectively.

When the maximum number of bit locations of minor block 432 have been programmed as determined for block 514 and the maximum number of bit locations of major block 436 have been programmed as determined for block 518, control engine 450 for block 526 disables monotonic counter 120 and ends for block 528. Control engine 450 may disable monotonic counter 120 in any suitable manner, such as by disabling any output of the values for volatile counter 210 and non-volatile counter 220 by MUX 452 or by controlling binary adder 410 to lock the value for volatile counter 210 at a predetermined value, such as zero for example, and controlling BTA 420 to lock the value for non-volatile counter 220 at a predetermined value, such as zero for example.

Although described as incrementing the value for monotonic counter 120, flow diagram 500 may be appropriately modified to decrement the value for monotonic counter 120 from a suitable initial maximum value to a suitable minimum value. Where monotonic counter 120 bases its value solely on the value for non-volatile counter 220 and excludes volatile counter 210, flow diagram 500 may be appropriately modified by removing blocks 510 and 512 such that control engine 450 determines whether minor block 432 may be updated any further for block 514 after the value for monotonic counter 120 has been read for block 508.

Flow diagram 500 may also be modified in other suitable manners. As one example, in lieu of blocks 510 and 512, control engine 450 may determine whether the value for volatile counter 210 is at a predetermined maximum value. If not, control engine 450 may then increment the value for volatile counter 210 and end for block 528. If so, control logic 250 may then reset the value for volatile counter 210 and proceed to block 514.

Flow diagram 500 may also be modified by performing block 522 prior to block 520. Major block 436 may then be updated after block 506 if power to monotonic counter 120 is lost or deactivated during the erase for block 522. Also, flow diagram 500 may be modified by performing, instead of blocks 506 and 524, blocks 518–526 if ready bit locations 433 of minor block 432 are not set in a predetermined manner for block 504.

Monotonic counter 120 may be implemented in other suitable manners. Although illustrated as comprising local dedicated devices, the devices for monotonic counter 120 may be distributed and/or shared throughout computer system 100. Non-volatile memory 230, for example, may form at least a portion of mass memory 110 and/or mass memory 112, for example. Also, control engine 450 may be used to also control other flash memory for computer system 100.

Monotonic counter 120 may also be emulated in whole or in part in software by processor 102 using at least a portion of mass memory 110 and/or mass memory 112, for example, as non-volatile memory 230. Processor 102 for one embodiment may implement the functioning of volatile counter 210, non-volatile counter 220, and control logic 250 in software in accordance with flow diagram 300, for example. Such software may be stored on any suitable computer readable medium, such as for static memory 106, main memory 108, mass memory 110 and/or mass memory 112, for example. Processor 102 may maintain the values for volatile counter 210 and non-volatile counter 220, for example, in suitable registers in processor 102 and/or in main memory 108.

In the foregoing description, the invention has been described with reference to specific exemplary embodiments thereof. It will, however, be evident that various modifications and changes may be made thereto without departing from the broader spirit or scope of the present invention as defined in the appended claims. The specification and drawings are, accordingly, to be regarded in an illustrative rather than a restrictive sense.

What is claimed is:

1. A method comprising:
   maintaining a first value for a first counter based on a content of a volatile memory as a first component of a monotonic count;
   maintaining a second value for a second counter based on a content of a non-volatile memory as a second component of a monotonic count; and
   controlling updates to the first value for the first counter and to the second value for the second counter at control logic by updating the first value for the first counter in response to the reading of the monotonic count.

2. The method of claim 1, wherein the controlling comprises updating the second value for the second counter when the first value for the first counter meets a predetermined condition.

3. The method of claim 1, wherein controlling updates further comprises disabling read accesses to the first counter and the second counter while the monotonic count is updated.

4. The method of claim 1, wherein the controlling comprises updating the second value upon a power on reset.

5. The method of claim 1, wherein the controlling comprises updating the second value by programming a bit location or locations in a flash memory.

6. The method of claim 1, wherein the controlling comprises updating the second value by updating a portion of a flash memory when another portion of the flash memory meets a predetermined condition.

7. A method comprising:
powering on a monotonic counter, the monotonic counter at least partially basing a count value on a content of a volatile memory utilized for lesser significant bits of the count value and a non-volatile memory utilized for higher significant bits of the count value; and
updating the count value for the monotonic counter by a first value on the powering on condition.

8. The method of claim 7, wherein the updating the count value for the monotonic counter comprises updating a flash memory to update the non-volatile memory.

9. An apparatus comprising:
a volatile counter to maintain lesser significant bits of monotonic count;
a non-volatile counter to maintain higher significant bits of the monotonic count based on a content of a non-volatile memory; and
control logic to control updating the first and second counters by updating the first counter when the monotonic count is read.

10. The apparatus of claim 9, wherein the control logic disables read accesses to the first counter and the second counter while the monotonic count is updated.

11. The apparatus of claim 9, wherein the control logic controls the non-volatile counter to update the second counter when the volatile counter meets a predetermined condition.

12. The apparatus of claim 9, wherein the control logic controls the non-volatile counter to update the second counter upon a power on reset.

13. The apparatus of claim 9, wherein the non-volatile memory comprises a flash memory and wherein the control logic to program a number of bit location or locations in the flash memory to update the second counter.

14. The apparatus of claim 9, wherein the non-volatile memory is separated into more than one block of flash memory, wherein individual blocks of flash memory are arranged to provide cascading of selective number of the higher significant bits of the monotonic count.

15. An apparatus comprising:
a volatile memory to maintain a first value for lesser significant bits of a count value for a first counter;
a non-volatile memory to maintain a second value for higher significant bits of the count value for a second counter; and
circuitry to maintain a monotonic count value, and to update the count value by a number in response to a read of the count value for the monotonic counter.

16. The apparatus of claim 15, wherein the non-volatile memory comprises a flash memory and wherein the circuitry updates the count value by the number by programming a bit location or locations in the flash memory.

17. The apparatus of claim 15, wherein the non-volatile memory comprises a first block of flash memory and a second block of flash memory and wherein the circuitry updates the second block of flash memory and erases the first block of flash memory when a predetermined condition is met.

18. An apparatus comprising:
a volatile memory to maintain a first value for a first counter;
a non-volatile memory to maintain a second value for a second counter; and
circuitry to maintain a count value for a monotonic counter, the circuitry to base the count value at least partially on the first value for lesser significant bits of the count value and the second value for higher significant bits of the count value, and to update the count value by a number in response to a powering on condition for the circuitry.

19. The apparatus of claim 18, wherein the non-volatile memory comprises a flash memory and wherein the circuitry updates the count value by the number by programming a bit location of locations in the flash memory.

20. The apparatus of claim 18, wherein the non-volatile memory comprises a first block of flash memory and a second block of flash memory and wherein the circuitry updates the second block of flash memory and erases the first block of flash memory when a predetermined condition is met.

21. An apparatus comprising:
one or more registers to store a first value;
a first adder to maintain the first value;
a flash memory to store a portion of bits used for a monotonic count;
one or more registers to store a second value;
a second adder to maintain the second value based on one or more programmed locations in the flash memory; and
a control engine to control the flash memory and the first and second adders, the first value used to determine lower significant bits of the monotonic count and the second value used to determine higher significant bits of the monotonic count, the lesser significant bits being volatile while higher significant bits being non-volatile.

22. The apparatus of claim 21, wherein the second value is updated when a predetermined condition is met in the one or more registers storing the first value.

23. The apparatus of claim 21, wherein the second value is updated when a power on reset condition occurs.

* * * * *

UNITED STATES PATENT AND TRADEMARK OFFICE
CERTIFICATE OF CORRECTION

PATENT NO. : 6,836,853 B1
DATED : December 28, 2004
INVENTOR(S) : Dover et al.

It is certified that error appears in the above-identified patent and that said Letters Patent is hereby corrected as shown below:

Column 3,
Line 62, delete "EPROM" and insert -- EEPROM --.

Signed and Sealed this

Twenty-fourth Day of May, 2005

JON W. DUDAS
*Director of the United States Patent and Trademark Office*